United States Patent [19]
Takahashi

[11] Patent Number: 5,540,593
[45] Date of Patent: Jul. 30, 1996

[54] COIL TYPE CONTACTOR AND CONNECTOR USING THE SAME

[75] Inventor: Toru Takahashi, Yokohama, Japan

[73] Assignee: Yamaichi Electronics Co., Ltd., Tokyo, Japan

[21] Appl. No.: 266,658

[22] Filed: Jun. 28, 1994

[30] Foreign Application Priority Data

Jun. 30, 1993 [JP] Japan ................................... 5-188961

[51] Int. Cl.[6] ....................................................... H01R 9/09
[52] U.S. Cl. .............................................. 439/66; 439/591
[58] Field of Search ............................... 439/66, 91, 591, 439/71

[56] References Cited

U.S. PATENT DOCUMENTS 4,029,375  6/1977  Gabrielian ................................. 439/66
5,030,109  7/1991  Dery .......................................... 439/66

*Primary Examiner*—Neil Abrams
*Attorney, Agent, or Firm*—Wenderoth, Lind & Ponack

[57] ABSTRACT

A coil type contactor comprising an electrically-conductive coil spring, each turn constituting the coil spring being inclined such that one end of a diameter of each turn occupies a lower position and the other end occupies an upper position. The turns are arranged such that axes passing through the centers of the respective turns are in parallel relation. Upper and lower ends of the coil spring serve as pressure receiving points, respectively, for achieving electrical connections. The turns are arranged such that they are partly short-circuited, or the turns are arranged proximate to each other so that the turns are short-circuited at an initial stage of compression.

11 Claims, 4 Drawing Sheets

1

COIL TYPE CONTACTOR AND CONNECTOR USING THE SAME

BACKGROUND OF THE INVENTION

1. Field of the Invention

This invention relates to a coil type contactor, as well as a connector using the same, which is suitable to be used for achieving an electrical connection with a leadless type IC package such as an LGA IC package, a BGA IC package or the like.

2. Prior Art

Mounting methods for electric parts have progressed so as to include planar mounting methods. The configuration of the electric part in the planar mounting methods in thus suitable for the planar mounting. In an LGA IC package and a BGA IC package, wiring patterns and soldering balls are densely arranged on a rear surface of the package. In the case of the LGA package, since wiring patterns are made in a state in which no convexities and no concavities are present on a flat rear surface of the package, it is technically difficult to connect the rear surface of the package to a wiring board by closely contacting the former directly to the latter. Therefore, a connector is definitely necessary for connecting the package to the wiring board. Also in the case of the BGA package, it is customary that the package is connected to the connecting pattern surface of the wiring board by means of soldering balls, or with the use of a connector.

In general, the basic construction of a connector used, for those IC packages is such that a contact point formed on a rear surface of the IC package is vertically pressed for connection with a contact portion of the wiring board via a contactor embedded in a connector. A restoring resilient force generated as a reaction when the contactor embedded in the connector is compressed serves as a contacting force. Therefore, the connector is normally sandwiched for use between the IC package and the wiring board, and is of a plate-like configuration capable of covering the entire surface of the contact portion. As one of the contactors which are vertically compressed, there can be contemplated a coil-like contactor formed of a coil spring.

Furthermore, due to the progression toward miniaturization and high function of ICs, contactors are required to be embedded in a connector at a high density. For example, a distance between adjacent contactors which are arranged in a vertical and horizontal pattern is required to be 1 mm and even 0.5mm in some cases. The number of the contactors to be arranged is usually 100 to 200. In some cases, the number of the contactors exceeds 300.

For surface mounting an IC package with a connector sandwiched between a wiring board and the IC package, an upper limit of a compressive force of a whole connector is required to be reduced in view of mechanical strength of the IC package when the IC package is miniaturized. For example, if a contacting force (compressive force) of a single contactor in a connector is 50 g, a contacting force of 15 kg is needed for 300 contactors. This is practically impossible to employ in view of the design of an apparatus. In the case of a multi-core connector having more than 200 pins, it becomes necessary to reduce the contacting force to 30 g in order to reduce the total compressive force. A contacting force of 30 g is a minimum contacting force for maintaining a stable contacted-state, and the spring characteristics of the contactor is important to contact reliability. A contactor satisfying such requirement is low in spring constant and high in flexibility. It is important that the contacting force is not greatly changed even when the compressive dimension is changed due to the dimensional change of an IC. With reference to an embodiment, it is preferable that the length of the contactor is from 1.5 mm to 2.0 mm when the contactor is in a compressed-state, and a compressive force of from 30 g to 40 g is generated when the contactor is compressed to between 70% and 60%.

This invention aims at the development of a contactor, as well as a connector using the same, which satisfies the above-mentioned conditions and which uses a spring capable of a vertical displacement, such as a coil spring to be described hereinafter.

In general, the coil spring can be a spring which is vertically flexed in the actual designing of the spring, i.e., as a "spring element" which is greatly deformed only in a Z-direction, which takes little space in X- and Y-directions, and which is not changed in dimension in the X- and Y-directions upon compression. However, since a coil spring is very long in electrically-conductive path length and overly large in inductance (L component), it cannot be used as a contactor. It came to the mind of the present inventor that if a coil spring having only a negligible amount of L component is made by improving this coil spring, a contactor having a high flexibility and a low spring constant may be developed. The present invention has been accomplished based on this finding.

SUMMARY OF THE INVENTION

Reviewing first the inductance (L component) of a contactor, taking a recent personal computer as an example, an operation frequency of from 20 Mhz to 30 Mhz is generally used in order to enhance the arithmetic processing speed. Furthermore, there is planning to operate the personal computer with such a high frequency as 50 Mhz or 100 Mhz. In order to apply such high frequency, the L component of the contactor must be "several nanohenries" or less, and preferably three nanohenries or less, if possible. In order to minimize the L component, it is an essential condition that a conductive portion of the contactor is short and a sectional area of the contactor is large. The requirement for greatly reducing the L component of a spring which is wound in a coil form, can be met by short-circuiting each turn of the coil spring. Based on this basic concept, the coil type contactors exemplified in FIGS. 2 and 3 and the connectors exemplified in FIGS. 4 to 9 are obtained.

From one aspect of the present invention, there is provided a coil type contactor comprising an electrically-conductive coil spring, each turn constituting the coil spring being inclined such that one end of a diameter of each turn occupies a lower position and the other end occupies an upper position. The turns are arranged such that axes passing through the centers of the respective turns are in parallel relation. Upper and lower ends of the coil spring serve as pressure receiving points, respectively, for achieving electrical connections. The turns are arranged such that they are partly short-circuited, or the turns are arranged proximate to each other so that the turns are short-circuited at an initial stage of compression.

From another aspect of the invention, there is provided a connector comprising an electrically-conductive coil spring, each turn constituting the coil spring being inclined such that one end of a diameter of each turn occupies a lower position and the other end occupies an upper position. The turns are arranged such that axes passing through the centers of the respective turns are in parallel relation. The coil spring is embedded in an insulative member having a compressive resiliency, and upper and lower ends of the coil spring serve as pressure receiving points, respectively, for achieving electrical connections. The turns are arranged such that they are partly short-circuited, or the turns are arranged proximate to each other so that the turns are short-circuited at an initial stage of compression.

From a further aspect of the invention, there is provided a connector comprising an electrically-conductive coil spring, each turn constituting the coil spring being inclined such that one end of a diameter of each turn occupies a lower position and the other end occupies an upper position. The turns are arranged such that axes passing through the centers of the respective turns are in parallel relation. The coil spring is inserted and retained in a through-hole formed in a rigid insulative member, and upper and lower ends of the coil spring serve as pressure receiving points, respectively, for achieving electrical connections. The turns are arranged such that they are partly short-circuited, or the turns are arranged proximate to each other so that the turns are short-circuited at an initial stage of compression.

The turns on the upper end and/or lower end of the coil spring may be allowed to partly project from a surface of the insulative member.

As mentioned above, in the coil type contactor, while enjoying the advantages of a coil spring that the vertical compressibility, is good and can be accomplished with a reduced force, the width (thickness) of the contactor can be reduced and the height (length) of the contactor can also be greatly reduced. Therefore, the present invention can contribute to a realization of a dense arrangement of contactors and a miniaturization of connectors.

Also, in the coil type contactor according to the present invention, the contactor can be compressed while closely contacting the turns (forming a short-circuit), which is impossible for a normal coil spring. By forming a short-circuit in the respective turns, the electrically-conductive path length can be extremely reduced in spite of the fact that the contactor is a coil. By this, the large inductance (L component), which is regarded as one of the shortcomings inherent in a regular coil spring, can be made almost negligible.

Also, the contactor restrained by the insulative member can be compressed. When compressed, the continuous turns are rubbed with each other with a stronger force to cause a wiping action at the short-circuited portion, thus enabling the formation of a favorable electrically-conductive path.

DETAILED DESCRIPTION OF THE EMBODIMENT

Several embodiments of the present invention will be described with reference to FIGS. 1 through 9 of the accompanying drawings.

Figure 2:
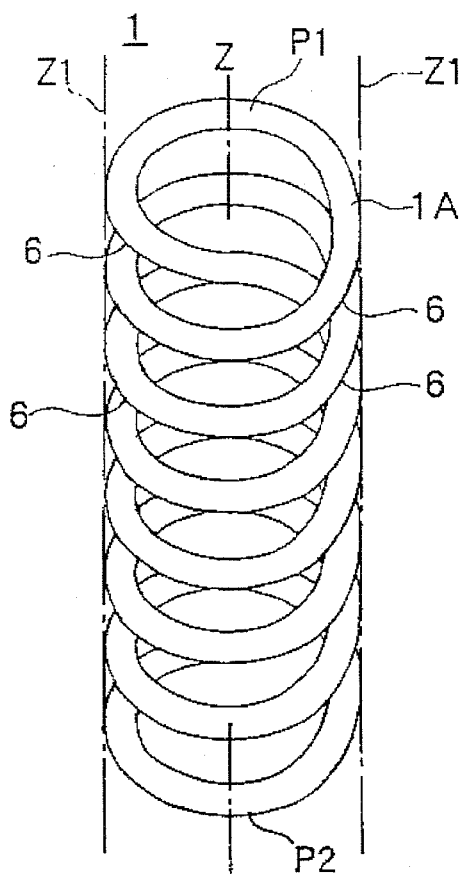
FIG. 2 is a front view of a coil type contactor according to the present invention.
Figure 3:
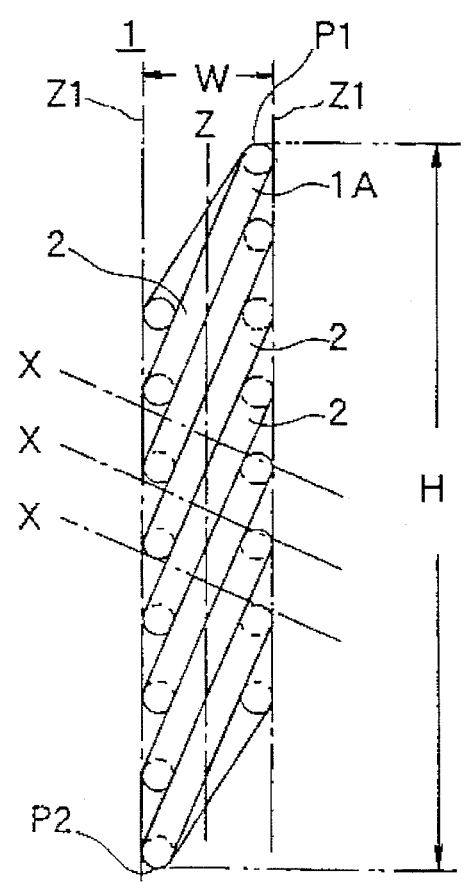
FIG. 3 is a side view of the coil type contactor of FIG. 2.

FIGS. 2 and 3 show one embodiment of a coil type contactor 1 according to the present invention, FIG. 2 is a front view thereof, and FIG. 3 is a side view thereof. This coil type contactor 1 comprises an electrically-conductive coil spring 1A. Each turn 2 constituting the coil spring 1A is inclined such that one end of a diameter of each turn occupies a lower position and the other end occupies an upper position (i.e., the coil spring 1A is a canted coil spring). The turns 2 are arranged to be equal in inclination angle so that axes X passing through the centers of the respective turns 2 are oblique, relative to a central longitudinal axis Z of the coil spring 1A, and in a parallel relation. Ideally, the axes X are in parallel relation to each other. Upper and lower ends of the coil spring 1A serve as pressure receiving points P1 and P2, respectively, for achieving an electrical connection with an electric part. The turns 2 are arranged in intimately contacted relation so that they are partly short-circuited, or the turns 2 are arranged proximate to each other so that the turns 2 are short-circuited at an initial stage of compression. Reference numeral 6 denotes short-circuited portions between adjacent turns 2.

Each turn 2 constituting the coil type contactor 1 has its center on the axis Z which extends in a compressing direction. The respective turns 2 are orderly arranged such that imaginary lines Z1 along longitudinal sides of the turns 2 are in alignment with each other. Accordingly, the imaginary lines Z1 and the axis Z are in a parallel relation with respect to each other. Compared to a regular coil type contactor, the coil type contactor 1 is greatly reduced in width on the side from which the turns 2 are viewed as oblique, and also greatly reduced in height (length) H.

As one example of a method for making the coil type contactor 1, a wire such as a copper alloy which is closely wound into a regular coil form is prepared. Then, a downward crushing force is applied to one end at one diameter side of the coil-like material and an upward crushing force is applied to the other end so that the coil-like material is permanently deformed into the above-mentioned configuration. The turns 2 of such obtained contactor 1 have the axes X arranged in parallel relation and are expanded and contracted in a closely contacted condition.

A material of the coil type contactor 1 is preferably electrically conductive, soft, easy to bend, and able to be hardened by heating, etc., after being machined or processed. An acceptable material includes, for example, a beryllium-copper alloy, a titanium-copper alloy, etc.

Next, FIGS. 1 and 4 through 9 show embodiments of a connector 3 in which the coil type contactor 1 is used.

Figure 8:
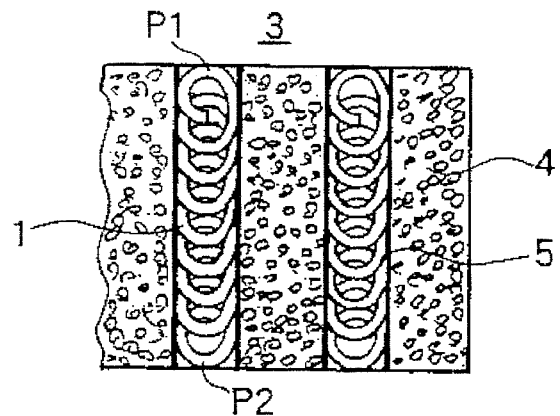
FIG. 8 shows an additional example of a connector using the above coil type contactor, in which the connector is shown in a front view and an important portion is shown in a sectional view.
Figure 9:
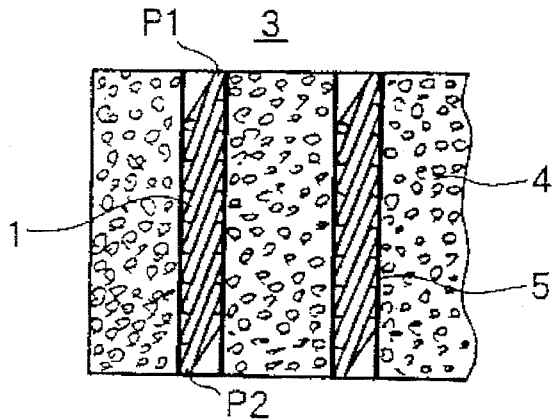
FIG. 9 shows the connector of FIG. 8, but in which the connector is shown in a side view and an important portion is shown in a sectional view.

In the embodiment of FIGS. 8 and 9, the connector 3 comprises a coil type contactor 1 having the above-mentioned construction, the coil type contactor 1 being embedded in a plate-like insulative member 4 (insulative sheet) having a compressive resiliency, such as, for example, a foamed synthetic resin material. Upper and lower ends of the coil spring 1A forming the contactor 1 serve as pressure receiving points P1 and P2, respectively, for respectively contacting electric parts, the turns being arranged such that they are partly short-circuited, or the turns being arranged proximate to each other so that the turns are short-circuited at an initial stage of compression.

The coil type contactor 1 is integrally inserted when the insulative member 4 is molded, or as shown in FIGS. 8 and 9, the insulative member 4 is provided with through-holes 5 which are open to upper and lower surfaces of the insulative member 4, the coil type contactor 1 is forcibly inserted and retained in each through-hole 5, and upper and lower ends of the coil type contactor 1 are arranged in the open face of the through-hole 5, i.e., in the upper and lower surfaces of the insulative member 4 so as to serve as the pressure receiving points P1 and P2, respectively.

An inner wall of the through-hole 5 resiliently captures the contactor 1 with an appropriate amount of interference fit force in order to retain the contactor 1.

The IC package and the wiring board are superimposed on the upper and lower surfaces of the insulative member 4. That is, the connector 1 is placed between the IC package and the wiring board in a sandwiched manner and a compressive force is applied thereto. As a result, the insulative member 4 is compressed. As the compression progresses, the coil type contactor 1 is compressed. As a reaction thereof, the coil type contactor 1 presses the pressure receiving points P1 and P2 against the contact portions of the IC package and the wiring board, to provide a contact pressure.

The contactor 1 is applied with a compressive force while receiving a resilient restriction from the inner wall of the through-hole 5 at the time of compression. As a result, the turns 2 are rubbed with each other by a stronger force, thereby causing a wiping action in the short-circuited portion 6 and also forming a favorable electrically-conductive path which is substantially equal to the height (length) H of the contactor 1. This invention includes a case wherein upper and lower ends of the contactor 1 are allowed to project from upper and lower surfaces of the insulative member when the contactor 1 is retained by the insulative member 4 having a compressive resiliency.

Figure 6:
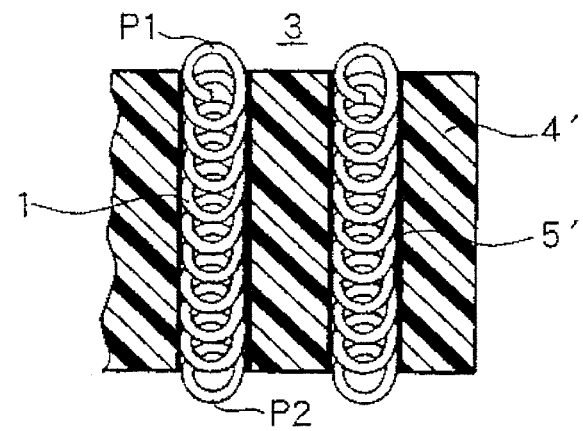
FIG. 6 shows another example of a connector using the above coil type contactor, in which the connector is shown in a front view and an important portion is shown in a sectional view.
Figure 7:
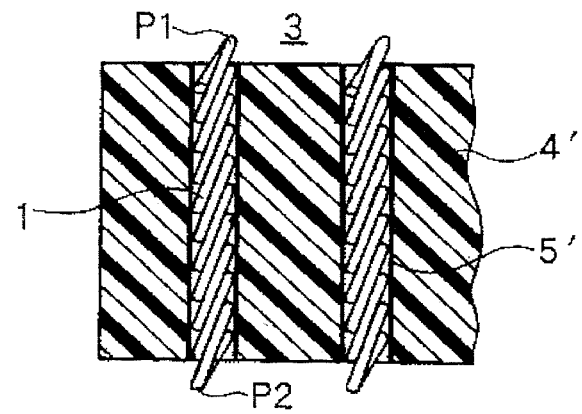
FIG. 7 shows the connector of FIG. 6, but in which the connector is shown in a side view and an important portion is shown in a sectional view.

Next, FIGS. 6 and 7 show another embodiment of a connector comprising a coil type contactor 1 having the above-mentioned construction. The coil type contactor 1 is forcibly inserted and retained in a through-hole 5' formed in a rigid insulative member 4', upper and lower ends of a coil spring 1A' forming the contactor 1 being allowed to project from an open face of the through-hole 5', i. e. , from the upper and lower surfaces of the insulative member 4' so as to serve as pressure receiving points P1 and P2 for contacting electric parts. As in the above-mentioned example, the turns 4 are arranged in such a manner as to be partly short-circuited, or they are arranged proximate to each other so that the turns 4 are short-circuited at an initial stage of compression. The insulative member 4' is formed of a rigid resin material.

Figure 4:
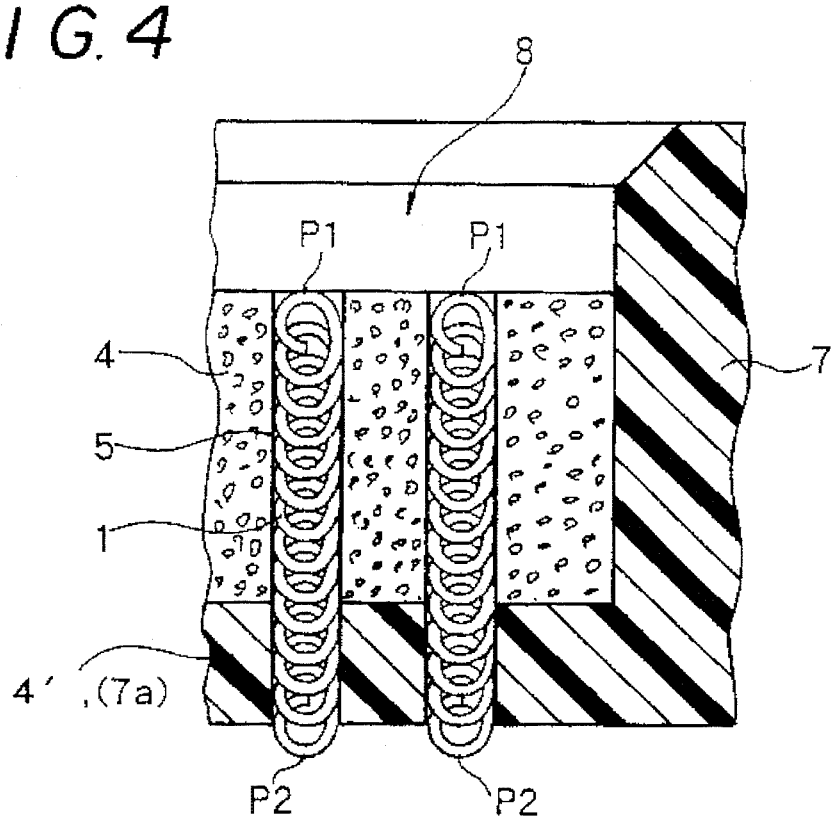
FIG. 4 shows one example of a connector using the above coil type contactor, in which the connector is shown in a front view and an important portion is shown in a sectional view.
Figure 5:
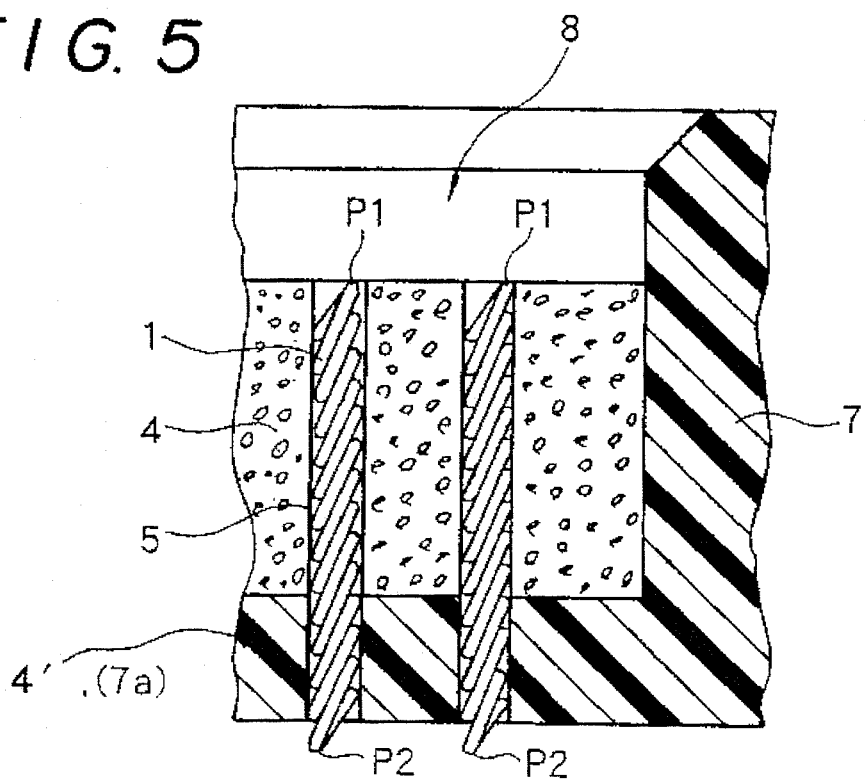
FIG. 5 shows the connector of FIG. 4, but in which the connector is shown in a side view and an important portion is shown in a sectional view.

Next, FIGS. 4 and 5 show another embodiment of a connector comprising a coil type contactor 1 having the above-mentioned construction, one end portion of the coil type contactor 1 being resiliently inserted and retained in a through-hole 5 of an insulative member 4 formed of a foamed synthetic resin material, the other end portion thereof being inserted in a through-hole 5' of an insulative member 4' formed of a rigid synthetic resin sheet.

The contactor 1 is arranged such that one end of the contactor 1 is disposed in an open face of the through-hole 5 formed in the insulative member 4 having a compressive resilient force, and the other end thereof is allowed to project from the open face of the through-hole 5' formed in the rigid insulative member 4', such that the ends of the contactor 1 serve as the pressure receiving points P1 and P2, respectively.

Figure 1:
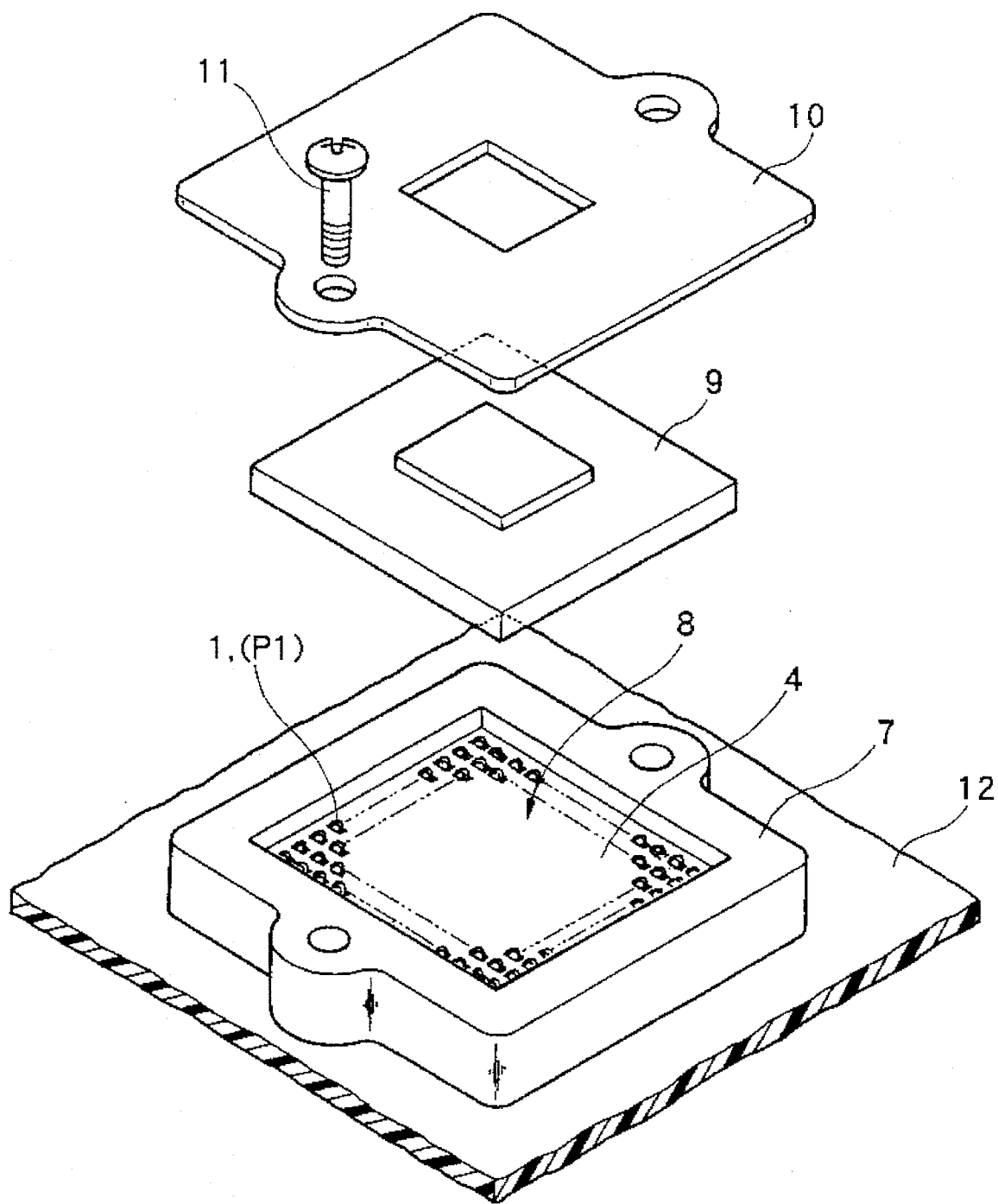
FIG. 1 is an exploded perspective view of a connector according the present invention.

Next, FIG. 1 concretely shows one embodiment of the above-mentioned connector. As illustrated, a flat box-like housing 7 having a bottom is formed with a chamber 8. This housing 7 is formed of a rigid synthetic resin material. Within the chamber 8 having a bottom, an insulative member 4 (insulative sheet) retaining the contactors 1 and having a compressive resiliency is laid. As shown in FIGS. 4 and 5, one end portion of the contactor 1 is inserted and retained in the through-hole 5 formed in the insulative member 4, and the other end portion thereof is allowed to project from the through-hole 5 so as to be inserted in the through-hole 5' formed in a bottom wall 7a of the housing 7. One end of the contactor 1 is arranged in an open face of the through-hole 5 of the insulative sheet 4, and the other end thereof is allowed to project from an open face of the through-hole 5' formed in the bottom wall 7a. The ends of each of the contactors 1 serve as pressure receiving points P1 and P2, respectively.

An IC package 9 is received in the chamber 8 of the housing 7 and superimposed on an upper surface of the insulative sheet 4. Furthermore, a pressure plate 10 is superimposed on a surface of the IC package 9, the pressure plate 10 is tightened down to the housing 7, and a wiring board 12 is superimposed on a lower surface of the housing 7, thereby pressing the IC package 9 in order to compress the insulative member 4 and the contactor 1. As a result, the contact portions of the IC package 9 are press contacted with the pressure receiving points P1 of the contactors 1. At the same time, the contact portions of the wiring board 12 are press contacted with the pressure receiving points P2 of the contactors 1.

According to the present invention, while enjoying the advantages of a coil spring that the vertical compressibility is good and can be accomplished with a reduced force, the width (thickness) of the contactor 1 can be reduced and the height (length) of the contactor 1 can also be greatly reduced. Therefore, the present invention can contribute to a realization of a dense arrangement of contactors and a miniaturization of connectors.

Also, in the coil type contactor according to the present invention, the contactor can be compressed while closely contacting the turns (forming short-circuits) which are impossible for a normal regular coil spring. By forming a short-circuit in the respective turns, the substantial electrically-conductive path length can be extremely reduced in spite of the fact that the contactor is a coil. By this, the inductance (L component), which is regarded as one of the shortcomings inherent in a regular coil spring, can be made almost negligible. Therefore, there can be provided a contactor which is well suited as a contactor for contacting a leadless type IC package, and which retains the advantages of a coil spring but eliminates the shortcomings of the coil spring.

Also, the contactor restrained by the insulative member is properly compressed. When compressed, the continuous turns are rubbed with each other with a stronger force to cause a wiping action at the short-circuited portion, thus enabling the formation of a favorable electrically-conductive path.

According to the present invention, a plane mounting type connector using a coil spring can effectively be put into actual use.

Although the present invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A connector for use in providing electrical connection between first and second electric parts, said connector comprising:

an insulating member having a plurality of contact-receiving holes formed therethrough, each of said contact-receiving holes having a longitudinal axis;

a plurality of electrically conductive contact elements mounted in said contact-receiving holes, respectively, of said insulating member;

wherein said contact elements comprise electrically conductive canted coil springs, respectively, having central longitudinal axes parallel to said longitudinal axes of said contact-receiving holes, respectively;

wherein each of said coil springs has a plurality of turns having central axes inclined relative to said central longitudinal axis and parallel to one another;

wherein each of said turns has first and second diametrically opposed portions which are spaced from one another in a longitudinal direction of the respective coil spring; and wherein the first portion of an endmost turn at a first end of each of said coil springs constitutes a first electric part contacting portion, and the second portion of an endmost turn at a second end of each of said coil springs constitutes a second electric part contacting portion.

2. A connector as recited in claim 1, wherein for each of said coil springs, said turns are arranged so as to be partially short-circuited or so as to be short-circuited when subjected to initial compression forces applied in opposing longitudinal directions of said coil spring at said first and second electric part contacting portions.

3. A connector as recited in claim 1, wherein for each of said coil springs, said turns are in short-circuit contact with one another at portions thereof intermediate said first and second ends thereof, or said turns are spaced from one another such that they come into short-circuit contact with one another at portions thereof intermediate said first and second portions thereof.

4. A connector as recited in claim 1, wherein for each of said coil springs, said turns are in short-circuit contact with one another at portions thereof intermediate said first and second portions thereof.

5. A connector as recited in claim 1, wherein said insulative member comprises a compressible elastic insulative member.

6. A connector as recited in claim 5, wherein for each of said coil springs, at least one of said endmost turn at said first end of said coil spring and said endmost turn at said second end of said coil spring projects outwardly of the respective contact-receiving hole absent an external compressive force.

7. A connector as recited in claim 1, wherein said insulative member comprises a rigid insulative member.

8. A connector as recited in claim 7, wherein for each of said coil springs, at least one of said endmost turn at said first end of said coil spring and said endmost turn at said second end of said coil spring projects outwardly of the respective contact-receiving hole absent an external compressive force.

9. A connector as recited in claim 1, wherein for each of said coil springs, at least one of said endmost turn at said first end of said coil spring and said endmost turn at said second end of said coil spring projects outwardly of the respective contact-receiving hole absent an external compressive force.

10. A connector as recited in claim 1, wherein for each of said coil springs, said central axes of said turns are oriented relative to said central longitudinal axis of said coil spring in such a manner that said turns constitute means for rubbing against one another upon imposition of compression forces applied in opposing longitudinal directions of said coil spring at said first and second electric part contacting portions.

11. A connector as recited in claim 1, wherein for each of said coil springs, said first electric part contacting portion and said second electric part contacting portion protrude in opposite longitudinal directions beyond all other portions of said coil spring so as to constitute means for exclusively contacting the first and second electric parts.

* * * * *